US010696844B2

(12) United States Patent
Xi et al.

(10) Patent No.: US 10,696,844 B2
(45) Date of Patent: Jun. 30, 2020

(54) HALOGEN-FREE FLAME RETARDANT TYPE RESIN COMPOSITION

(71) Applicant: SHENGYI TECHNOLOGY CO., LTD., Dongguan, Guangdong (CN)

(72) Inventors: Long Xi, Dongguan (CN); Yueshan He, Dongguan (CN); Biwu Wang, Dongguan (CN)

(73) Assignee: SHENGYI TECHNOLOGY CO., LTD., Dongguan (CN)

(*) Notice: Subject to any disclaimer, the term of this patent is extended or adjusted under 35 U.S.C. 154(b) by 513 days.

(21) Appl. No.: 15/120,549

(22) PCT Filed: Feb. 11, 2015

(86) PCT No.: PCT/CN2015/072756
§ 371 (c)(1),
(2) Date: Aug. 22, 2016

(87) PCT Pub. No.: WO2015/127860
PCT Pub. Date: Sep. 3, 2015

(65) Prior Publication Data
US 2017/0009074 A1 Jan. 12, 2017

(30) Foreign Application Priority Data
Feb. 25, 2014 (CN) .......................... 2014 1 0064624

(51) Int. Cl.
B32B 27/38 (2006.01)
B32B 27/20 (2006.01)
B32B 27/42 (2006.01)
B32B 15/08 (2006.01)
B32B 27/28 (2006.01)
C08L 79/04 (2006.01)
C08L 63/00 (2006.01)
C08J 5/24 (2006.01)
(Continued)

(52) U.S. Cl.
CPC .............. *C08L 79/04* (2013.01); *B32B 15/08* (2013.01); *B32B 15/092* (2013.01); *B32B 27/16* (2013.01); *B32B 27/18* (2013.01); *B32B 27/20* (2013.01); *B32B 27/38* (2013.01); *B32B 27/42* (2013.01); *C08J 5/24* (2013.01); *C08K 3/22* (2013.01); *C08K 3/36* (2013.01); *C08K 5/3445* (2013.01); *C08K 5/521* (2013.01); *C08K 5/5399* (2013.01); *C08L 61/06* (2013.01); *C08L 61/34* (2013.01); *C08L 63/00* (2013.01); *C08L 79/085* (2013.01); *H05K 1/0373* (2013.01); B32B 2264/102 (2013.01); B32B 2305/076 (2013.01); B32B 2307/3065 (2013.01); B32B 2307/558 (2013.01); B32B 2457/08 (2013.01); C08J 2379/04 (2013.01); C08J 2463/00 (2013.01); C08J 2479/04 (2013.01); C08J 2479/08 (2013.01); C08L 2201/02 (2013.01); C08L 2201/08 (2013.01); C08L 2201/22 (2013.01); C08L 2203/20 (2013.01); C08L 2205/03 (2013.01); H05K 1/0326 (2013.01); H05K 1/0366 (2013.01); H05K 2201/012 (2013.01)

(58) Field of Classification Search
CPC ........ C08L 63/00; C08L 79/085; C08L 61/06; C08L 61/34; C08L 2201/02; C08L 2201/08; C08L 2201/22; C08L 2203/20; C08L 2205/03; C08L 79/04; C08K 5/3445; C08K 3/22; C08K 3/36; C08K 5/521; C08K 5/5399; C08K 13/02; C08K 5/523; B32B 15/08; B32B 15/092; B32B 2264/102; B32B 2307/3065; B32B 2307/558; B32B 2457/08; B32B 27/16; B32B 27/18; B32B 27/20; B32B 27/38; B32B 27/42; B32B 2305/076; C08J 2379/04; C08J 2463/00; C08J 2479/04; C08J 2479/08; C08J 5/24; H05K 1/0326; H05K 1/0366; H05K 1/0373; H05K 2201/012
See application file for complete search history.

(56) References Cited

U.S. PATENT DOCUMENTS 4,229,351 A * 10/1980 Kiefer ................ C07D 207/448
548/522
4,927,736 A 5/1990 Mueller et al.
(Continued)

FOREIGN PATENT DOCUMENTS

CN 1680375 A 10/2005
CN 1989203 A 6/2007
(Continued)

OTHER PUBLICATIONS

Machine translation of JP 2010-100802. (Year: 2010).*
Liu, Jia "Synthesis and Properties of Novel Heat Resistant, Halogen-Free Flame Retardant Epoxy Resin," Science-Engineering (A), China Master Thesis Full Text Database, vol. / No. 06 Jun. 15, 2013, pp. B016-B161.
Australian Office Action for Application No. 2016247084, dated Apr. 19, 2017. 9 pages.
International Search Report for Application No. PCT/CN2016/077730, dated Jun. 30, 2016. 4 pages.
(Continued)

*Primary Examiner* — John D Freeman
(74) *Attorney, Agent, or Firm* — McCarter & English, LLP; Steven G. Davis; Wei Song

(57) ABSTRACT

The present invention relates to a halogen-free flame-retardant resin composition, based on the weight parts of organic solids, comprising (A) from 1 to 10 parts by weight of bismaleimide resin, (B) from 30 to 60 parts by weight of benzoxazine resin, (C) from 10 to 40 parts by weight of polyepoxy compound, (D) from 5 to 25 parts by weight of phosphorous-containing flame retardant, and (E) from 1 to 25 parts by weight of curing agent, which is amine curing agent and/or phenolic resin curing agent. The present invention further provides prepregs, laminates, laminates for printed circuits prepared from said resin composition.

20 Claims, No Drawings

(51) Int. Cl.
   *H05K 1/03* (2006.01)
   *C08K 5/5399* (2006.01)
   *C08K 5/521* (2006.01)
   *B32B 27/16* (2006.01)
   *C08L 79/08* (2006.01)
   *C08K 5/3445* (2006.01)
   *C08K 3/36* (2006.01)
   *C08L 61/06* (2006.01)
   *C08L 61/34* (2006.01)
   *C08K 3/22* (2006.01)
   *B32B 15/092* (2006.01)
   *B32B 27/18* (2006.01)

(56) References Cited

U.S. PATENT DOCUMENTS

| | | | |
|---|---|---|---|
| 9,873,789 | B2 | 1/2018 | Zeng et al. |
| 2010/0063184 | A1* | 3/2010 | Dershem ............ C09J 135/06 524/87 |
| 2010/0227090 | A1 | 9/2010 | Liao et al. |
| 2012/0136094 | A1 | 5/2012 | Chen et al. |
| 2013/0161080 | A1 | 6/2013 | Lin |
| 2014/0228483 | A1 | 8/2014 | Shirrell |
| 2014/0342161 | A1 | 11/2014 | Zeng |
| 2015/0291726 | A1 | 10/2015 | Mueller et al. |
| 2015/0344617 | A1 | 12/2015 | Arita et al. |
| 2017/0002131 | A1 | 1/2017 | Zeng et al. |
| 2018/0016387 | A1 | 1/2018 | Xu et al. |

FOREIGN PATENT DOCUMENTS

| | | | |
|---|---|---|---|
| CN | 101244645 A | | 8/2008 |
| CN | 101831051 A | | 9/2010 |
| CN | 102051022 A | | 5/2011 |
| CN | 102134375 A | | 7/2011 |
| CN | 102206397 A | | 10/2011 |
| CN | 102399415 A | | 4/2012 |
| CN | 102516541 A | | 6/2012 |
| CN | 102558858 A | | 7/2012 |
| CN | 102732029 A | | 10/2012 |
| CN | 102850545 A | | 1/2013 |
| CN | 102858839 A | | 1/2013 |
| CN | 102977551 A | | 3/2013 |
| CN | 103265791 A | | 8/2013 |
| CN | 103382242 A | | 11/2013 |
| CN | 103421273 A | | 12/2013 |
| CN | 103540220 A | | 1/2014 |
| CN | 103834168 A | | 6/2014 |
| CN | 103992621 A | | 8/2014 |
| CN | 104592467 A | | 5/2015 |
| CN | 105295041 A | | 2/2016 |
| CN | 105440263 A | | 3/2016 |
| CN | 105482076 A | | 4/2016 |
| EP | 0113575 A1 | | 7/1984 |
| EP | 2770024 A1 | | 8/2014 |
| EP | 2896654 A1 | | 7/2015 |
| JP | S61167684 A | | 7/1986 |
| JP | H01319528 A | | 12/1989 |
| JP | H11052567 A | | 2/1999 |
| JP | 2000186133 A | | 7/2000 |
| JP | 2001348420 A | | 12/2001 |
| JP | 2003231753 A | | 8/2003 |
| JP | 2003-252958 A | | 9/2003 |
| JP | 2009-235165 A | | 10/2009 |
| JP | 2010053070 A | | 3/2010 |
| JP | 2010053071 A | | 3/2010 |
| JP | 2010100802 A | * | 5/2010 |
| JP | 2011173827 A | | 9/2011 |
| JP | 2014-132074 A | | 7/2014 |
| KR | 10-2011-0048049 A | | 5/2011 |
| KR | 10-2012-0079986 A | | 7/2012 |
| KR | 2013-0125384 A | | 11/2013 |
| WO | 2000037442 A1 | | 6/2000 |
| WO | 2011/059633 A2 | | 5/2011 |
| WO | 2012124780 A1 | | 9/2012 |
| WO | 2014/061450 A1 | | 4/2014 |
| WO | 2014/076024 A1 | | 5/2014 |
| WO | 2015/127860 A1 | | 9/2015 |
| WO | 2015/179232 A1 | | 11/2015 |
| WO | 2016101538 A1 | | 6/2016 |
| WO | 2016101540 A1 | | 6/2016 |

OTHER PUBLICATIONS

Supplementary European Search Report for Application No. 16785078. 3, dated Dec. 7, 2017. 6 pages.
Supplementary European Search Report for Application No. 15864296. 7, dated Jul. 27, 2017. 6 pages.

* cited by examiner

HALOGEN-FREE FLAME RETARDANT TYPE RESIN COMPOSITION

CROSS-REFERENCE TO RELATED APPLICATIONS

This application is a U.S. national stage filing, under 35 U.S.C. § 371(c), of International Application No. PCT/CN2015/072756, filed on Feb. 11, 2015, which claims priority to Chinese Patent Application No. 201410064624.X, filed on Feb. 25, 2014. The entire contents of each of the aforementioned applications are incorporated herein by reference.

TECHNICAL FIELD

The present invention relates to a resin composition, and especially relates to a halogen-free flame-retardant resin composition, as well as prepregs, laminates, laminates for printed circuits prepared therefrom.

BACKGROUND ART

With the technical development in recent years, especially after *Waste Electrical and Electronic Equipment Directive and the Restriction of the Use of Certain Hazardous Substances in Electrical and Electronic Equipment* were implemented by European Union on Jul. 1, 2006, halogen-free flame-retardant laminates for printed circuits become main laminates in the market. In order to achieve halogen-free of laminates for printed circuits, the compounds containing dihydrobenzoxazine ring, and phosphorous-containing compounds may be used to achieve phosphorous-nitrogen synergistic flame retardancy. The laminates for printed circuits prepared by using benzoxazines have lower water absorption, excellent heat resistance and higher reliability, so as to occupy a certain market scale. However, benzoxazine resin has a higher hardness after curing, and a higher fragility than epoxy resin, so as to readily result in more drill abrasion and more processing difficulties when the laminates are processed. Correspondingly, toughening modification of benzoxazines becomes a research key point in the art.

One of the common methods for toughening is to add thermoplastic resins as modifying toughening agent, e.g. blending polyaryletherketone and polyarylethersulfone thermoplastic resins with benzoxazines and modifying. Such method can effectively form phase separation structure, reduce the expansion of cracks inside the material, and absorb the impact energy suffered by the material. Another method is to add rubber for toughening, e.g. amino-terminated butyronitrile rubber (ATBN), carboxyl-terminated butyronitrile rubber (CTBN) and other core-shell rubbers. Such method can also effectively absorb the impact energy suffered by the material, and increase the elongation at break. However, the laminates made by the modified benzoxazines with said methods all have a reduced glass transmission temperature, a greatly reduced and unstable heat resistance, and a sharply reduced humidity resistance. Due to the complicated system structure, the Anti-CAF cannot be ensured.

In conclusion, it is important to effectively modify benzoxazine resins used in the laminates for printed circuits, and to improve the toughness of the material while ensuring the heat resistance and glass transmission temperature. CN102850545A mentions preparing blended resins having high toughness and heat resistance by melt-blending/solution blending trimethyl hexamethylene bismaleimide resin with benzoxazine resin. However, there are more side chains in the bismaleimide resin structure, and the resin mixture cannot form specific phases unless in specific ratio. For such phases, phase separation readily takes place after these two resins are blended with other components during actual applications, which severely restricts the application prospect thereof in the electronic industry.

CN102134375 provides a halogen-free high Tg resin composition, and prepregs and laminates prepared therefrom. Although the resin composition provided therein has a high Tg, a low water absorption, low CET and better dielectric properties, it has a worse toughness and is difficult for mechanical processing, so that the industrialization thereof cannot be achieved.

CN102977551A provides a halogen-free resin composition, and a process for preparing copper-clad laminates by using the same. The halogen-free resin composition provided therein has excellent heat resistance and better processability, but the toughness thereof is worse and need to be further improved.

Therefore, it is required in the art to develop a halogen-free resin composition having excellent comprehensive properties, wherein the halogen-free resin composition shall have high glass transmission temperature, high reliability, inflaming retarding, dip soldering resistance, chemical resistance, low water absorption, lower dielectric dissipation factor, but have a lower brittleness and a higher toughness at the same time.

DISCLOSURE OF THE INVENTION

One of the objects of the present invention is to provide a halogen-free flame-retardant resin composition, wherein the composition improves the toughness while ensuring the heat resistance and humidity resistance of the current benzoxazine resins, by combining benzoxazine resin and bismaleimide resin in a proper ratio, as well as a suitable amount of polyepoxy compound, phosphorous-containing flame retardant and curing agent.

The second object of the present invention is to provide a prepreg prepared from the aforesaid halogen-free flame-retardant resin composition, wherein the prepreg has excellent flame retardant property, and the advantages of high glass transmission temperature (Tg), high heat resistance, high bending strength, high reliability, lower dielectric dissipation factor, low water absorption, low thermal expansion coefficient (C.T.E) and the like. In addition, the prepreg also has excellent chemical resistance and mechanical processing properties.

The third object of the present invention is to provide a laminate prepared from the aforesaid halogen-free flame-retardant resin composition, wherein the laminate has excellent flame retardant property, and the advantages of high glass transmission temperature (Tg), high heat resistance, high bending strength, high reliability, lower dielectric dissipation factor, low water absorption, low thermal expansion coefficient (C.T.E) and the like. In addition, the laminate also has excellent chemical resistance and mechanical processing properties.

The fourth object of the present invention is to provide a laminate for printed circuit, prepared from the aforesaid halogen-free flame-retardant resin composition, wherein the laminate for printed circuit has excellent flame retardant property, and the advantages of high glass transmission temperature (Tg), high heat resistance, high bending strength, high reliability, lower dielectric dissipation factor, low water absorption, low thermal expansion coefficient (C.T.E) and the like. In addition, the laminate for printed circuit also has excellent chemical resistance and mechanical processing properties.

The present invention is realized by the following specific solution.

The present invention relates to a halogen-free flame-retardant resin composition, based on the weight parts of organic solids, comprising
(A) from 1 to 10 parts by weight of bismaleimide resin,
(B) from 30 to 60 parts by weight of benzoxazine resin,
(C) from 10 to 40 parts by weight of polyepoxy compound,
(D) from 5 to 25 parts by weight of phosphorous-containing flame retardant, and
(E) from 1 to 25 parts by weight of curing agent, which is amine curing agent and/or phenolic resin curing agent.

Bismaleimide has aliphatic chain segments having moderate length. In the halogen-free flame-retardant resin composition of the present invention, bismaleimide resin is used together with benzoxazine resin, and curing-crosslinked with other resins in the system in the curing phase of the resin composition, so as to achieve the objects of increasing the toughness and decreasing the processing difficulties, while maintaining high glass transmission temperature, high heat resistance and high humidity resistance of the halogen-free flame-retardant resins, under the joint action of bismaleimide 5-membered heterocyclic rings and aliphatic chain segments.

Bismaleimide resin has a greater viscosity, resulting in being difficult to control the production process of resins and unable controllable production. By choosing various raw materials in the halogen-free flame-retardant resin composition, and optimizing the contents of raw materials, the present invention achieves reducing the resin viscosity, solves the technical problem of being difficult to control the production process and provides possibility of controllable production.

In the halogen-free flame-retardant resin composition, bismaleimide resin is added in an amount of from 1 to 10 parts by weight, e.g. 2, 6, 8, 9 parts by weight, preferably from 3 to 7 parts by weight. If bismaleimide resin is added in an excessive amount, the curing temperature of the composition will be high and be incompatible with the current laminating process; the rigidity of the cured product will be reduced so as to be not conducive to the laminate application. Moreover, too much bismaleimide resin readily renders the increase of the composition viscosity, so as to result in difficulties to the industrial production. Less bismaleimide resin will result in less contribution to the toughness improvement of the composition, so as to be unable to achieve the object of increasing the toughness of the composition.

Preferably, the bismaleimide resin of the present invention is obtained by polymerizing any one or at least two of the following bismaleimide monomers,

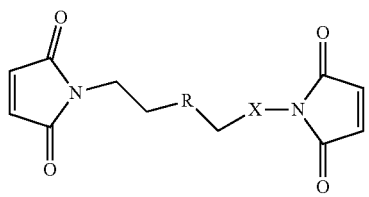

wherein R and X are independently selected from the group consisting of

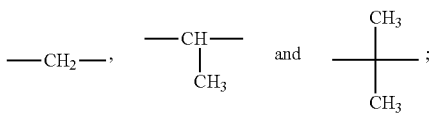

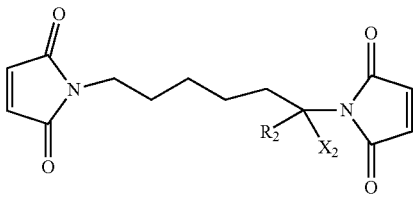

wherein $R_2$ and $X_2$ are independently selected from the group consisting of H and $CH_3$.

Bismaleimide is a bifunctional compound in which maleimide (MI) is used as the active terminal group. In the present invention, maleimide is 5-membered heterocyclic rings at both ends. In the molecular structure of the bismaleimide monomer of the present invention, maleimides at both ends are connected by straight chain or branched chain alkylene group, wherein the carbon atom number of the alkylene group is not specifically limited, and is preferably from 5 to 9. In said alkylene group, too many carbon atoms decrease the solubility of bismaleimide resin in solvent. When the solids content in the halogen-free resin composition is too high, bismaleimide resin is readily separated out. If the carbon atom number is less, it is difficult to synthesize the bismaleimide resin. Moreover, the strong interaction of 5-membered heterocyclic rings at both ends will cause that the composition has a harder structure and affect the toughness of the system.

In order to better fuse with other resins in the present invention and to reduce the crystallization tendency of resins, alkylene group of maleimide connecting both ends in the bismaleimide monomer is connected with from 1 to 4 methyl groups. That is to say, the alkylene group is branched chain alkylene groups. Typically but without limitation, the number of methyl groups connected with said alkylene group is 1, 2, 3, 4 and the like.

The present invention does not specifically limit the structure of the bismaleimide monomer therein. Those skilled in the art can, but are not limited to, choose from the structures of the aforesaid bismaleimide resins. Further preferably, the bismaleimide monomer has the structure of

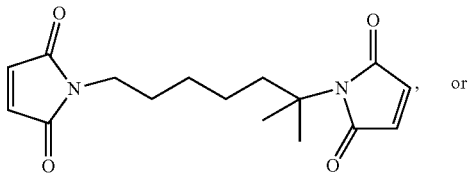

-continued

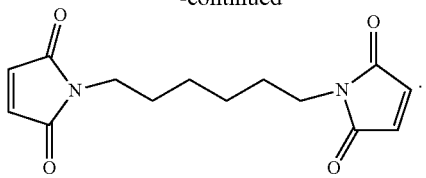

Benzoxazine resins, also called compounds having dihydrobenzoxazine rings, are benzo hexaheterocyclic compounds synthesized by using phenols, primary amines and formaldehyde as raw materials, and can be used for producing nitrogen-containing reticular structure similar to phenolic resin by ring-opening and polymerization. Benzoxazine resin in the present invention can increase the flame retardancy, humidity resistance, heat resistance, mechanical performance and electric performance required by the halogen-free resin composition and prepregs and laminates obtained therefrom.

In the halogen-free flame-retardant composition of the present invention, benzoxazine resin is added in an amount of from 30 to 60 parts by weight, e.g. 35, 43, 52, 58 parts by weight and the like, preferably from 40 to 60 parts by weight. If benzoxazine resin is added too much, the laminates will be too hard to be processed; if too less, the water absorption of the system will increase, and the glass transmission temperature (Tg), storage modulus, dielectric properties thereof will decrease.

The present invention does not specifically limit the type of benzoxazine resin, and benzoxazine resins known by those skilled in the art all can be used in the present invention.

Preferably, the benzoxazine resin is any one selected from the group consisting of bisphenol-A benzoxazine resin, bisphenol-F benzoxazine resin, phenolphthalein benzoxazine resin and MDA benzoxazine resin, or a combination of at least two selected therefrom.

The structures of bisphenol-A benzoxazine resin, bisphenol-F benzoxazine resin, phenolphthalein benzoxazine resin are shown in the following formula (γ),

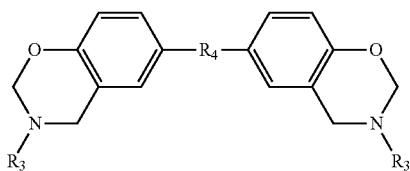

(γ)

wherein $R_3$ is

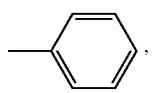

$R_4$ is any one selected from the group consisting of

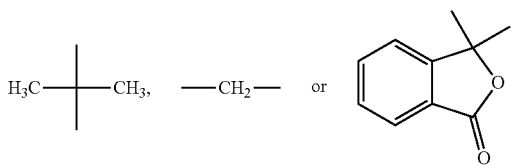

when $R_4$ is

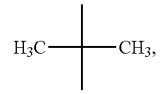

the structural formula (γ) is bisphenol-A benzoxazine resin monomer; when $R_4$ is —$CH_2$—, the structural formula (γ) is bisphenol-F benzoxazine resin monomer; when $R_4$ is

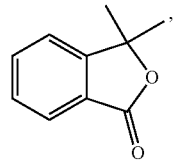

the structural formula (γ) is phenolphthalein benzoxazine resin monomer.

MDA benzoxazine resin, also called (4,4'-diamine diphenylmethane)benzoxazine resin, has the structure as shown in formula (δ), (δ)

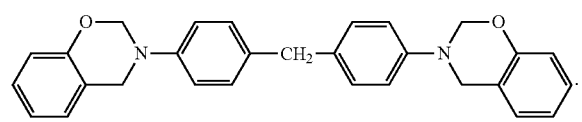

In the benzoxazine resin of the present invention, alkylene group exists in the molecular structure of bisphenol-F benzoxazine resin. While maintaining a certain rigidity, the viscosity thereof is relatively lower. Phenolphthalein benzoxazine resin and MDA benzoxazine resin show better heat resistance.

The combinations of benzoxazine resin of the present invention, typically but without limitation, comprise a combination of bisphenol-A benzoxazine resin and phenolphthalein benzoxazine resin, a combination of MDA benzoxazine resin and bisphenol-F benzoxazine resin, a combination of bisphenol-F benzoxazine resin, phenolphthalein benzoxazine resin and MDA benzoxazine resin and the like.

Further preferably, based on the weight of organic solids, the benzoxazine resin is in an amount (referring to the weight of organic solids) of more than 50% of the total weight of the resins in the halogen-free flame-retardant resin composition, wherein the total weight of the resins in the halogen-free flame-retardant resin composition is the sum of the weight (referring to the weight of organic solids) of bismaleimide resin, benzoxazine resin, polyepoxy compound, phosphorous-containing flame retardant and curing agent in the halogen-free flame-retardant resin composition.

The content of benzoxazine resin in the halogen-free flame-retardant resin composition is set as more than 50%, which can further increase the glass transmission temperature (Tg) of the composition. While the thermal decomposition temperature can reach more than 385° C., a lower water absorption (less than 0.1%) may be readily obtained. Due to the improvement of the aforesaid properties, the laminates prepared from such resin composition will achieve more notable improvement in reliability, and have a certain cost advantage.

In the present invention, benzoxazine resin cannot be blended with other component resins unless blended with bismaleimide resin firstly. The present invention does not specifically limit the blending manners. For example, solution blending or melt blending can be used in the present invention.

The typical but non-limiting solution blending of bismaleimide resin and benzoxazine resin has the following specific operations: separately dissolving bismaleimide resin and benzoxazine resin at a temperature of 20-50° C. in a solvent, blending these two resins after complete dissolution, mixing and continuously and homogeneously stirring.

The typical but non-limiting melt blending of bismaleimide resin and benzoxazine resin has the following specific operations: separately placing bismaleimide resin and benzoxazine resin at a temperature of 80-150° C. in a kettle with stirrer and heating device, stirring for 5-10 min.

In the present invention, polyepoxy compound can make the cured halogen-free resin composition, as well as prepregs and laminates, get basic mechanical and thermal properties. In the halogen-free flame retardant resin composition of the present invention, polyepoxy compound is added in an amount of from 10 to 40 parts by weight, e.g. 15, 23, 32, 38 parts by weight, preferably from 10 to 25 parts by weight. If polyepoxy compound is added too much, the water absorption will increase, and the thermal expansion coefficient of the system will also increase; too less amount will result in less adhesive property and lack of binding power between the prepared laminates and copper foils, and between the layers of laminates, as well as deteriorated processability.

The present invention does not limit the specific type of polyepoxy compound.

Preferably, the polyepoxy compound of the present invention is any one selected from the group consisting of bisphenol-A epoxy resin, bisphenol-F epoxy resin, phenol novolac epoxy resin, o-cresol formaldehyde epoxy resin, bisphenol-A novolac epoxy resin, epoxy resin having biphenyl structure, epoxy resin having aralkyl structure, dicyclopentadiene epoxy resin, halogen-free epoxy resin having oxazolidinone ring and epoxidised polybutadiene, or a combination of at least two selected therefrom. Said listed various polyepoxy compounds can be used separately or in combination.

The phosphorous-containing flame retardant of the present invention can improve the combustion performance of the halogen-free resin composition and prepregs and laminates obtained from said resins, so as to achieve flame retardant effect. In the halogen-free flame-retardant resin composition, the phosphorous-containing flame retardant is added in an amount of from 5 to 25 parts by weight, e.g. 7, 12, 18, 26 parts by weight and the like. If the phosphorous-containing flame retardant is added too much, the key performances of the resin compositions, e.g. heat resistance and humidity resistance will be decreased, and the separation of the phosphorous-containing flame retardant will bring failure risks to PCB processing. If the amount is too less, the prepared plates will result in lack of flame retardant property and bring safety risks to terminal products.

Preferably, the phosphorous-containing flame retardant in the halogen-free flame retardant resin composition of the present invention is added in an amount of from 8 to 18 parts by weight.

The present invention does not specifically limit the type of the phosphorous-containing flame retardant, e.g. phosphates and compounds thereof, phosphapheanthrene and derivatives thereof which can be readily conceived by those skilled in the art.

Preferably, the phosphorous-containing flame retardant of the present invention is any one selected from the group consisting of resorcinol-bi(diphenyl phosphate), bisphenol-A bi(diphenyl phosphate), resorcinol-bi(2,6-xylyl phosphate), dimethyl methylphosphate or phosphazene compound, or a combination of at least two selected therefrom, preferably phosphazene compound.

The phosphazene compound of the present invention is those containing cyclic compounds and chain-like phosphazene compounds, the softening point of which ranges from 60 to 150° C. When the phosphazene compound is used as the phosphorous-containing flame retardant, the amount thereof is preferably from 5 to 25 parts by weight, further preferably from 8 to 18 parts by weight. When the phosphazene compound is used as the flame retardant, the halogen-free flame-retardant resin composition has more excellent chemical resistance, and is hard to hydrolyze. When used for subsequent laminates for printed circuits, it has more excellent chemical resistance and Anti-CAF property, i.e. higher reliability.

The curing agent and the resins in the halogen-free resin composition of the present invention may have chemical reaction to form three-dimensional reticular polymers, and make linear resins into tough body solids. In the halogen-free flame-retardant resin composition of the present invention, the curing agent is added in an amount of from 1 to 25 parts by weight, e.g. 3, 8, 15, 18, 24 parts by weight. If the curing agent is added too much, e.g. over 25 parts by weight, the heat resistance of the resin cured products will deteriorate; if the amount is too less, e.g. lower than 1 part by weight, the resin composition will have inefficient solidification, and a decreased glass transmission temperature.

The present invention does not specifically limit the type of the curing agent. Preferably, the phenolic curing agent is any one selected from the group consisting of phenolic novolac resin, bisphenol-A novolac resin, nitrogen-containing novolac resin, biphenyl novolac resin, aralkyl novolac resin, alkyl novolac or phosphorous-containing novolac resin, or a combination of at least two selected therefrom.

In the curing agent of the present invention, the amine curing agent is any one selected from the group consisting of dicyandiamide curing agent and/or aromatic amine curing agent, wherein the aromatic amine curing agent is any one selected from the group consisting of diamino diphenyl ether, diamino diphenyl sulfone, diamino diphenyl methane, m-xylylenediamine or benzidine, or a combination of at least two selected therefrom.

Curing accelerator can speed up the reaction rate of the resin and curing agent, decrease the curing temperature, shorten the curing time, decrease the usage amount of the curing agent, and can improve the mechanical and chemical performance of resins at a certain extent. Therefore, the halogen-free flame-retardant resin composition of the present invention further preferably comprises from 0.1 to 1 part by weight of curing accelerator, e.g. 0.2, 0.5, 0.7, 0.9 parts by weight and the like.

The present invention does not specifically limit the type of the curing accelerator. Preferably, the curing accelerator is selected from imidazole compound, preferably any one selected from 2-methylimidazole, 2-ethyl-4-methylimidazole, 2-phenylimidazole or 2-undecylimidazole, or a combination of at least two selected therefrom.

In order to decrease the cost or improve the mechanical or chemical performance at a certain extent, a certain amount of filler may be added into the resin composition. Optionally, the halogen-free flame-retardant resin composition of the present invention further comprises from 5 to 60 parts by weight of filler, e.g. 6, 12, 23, 32, 38, 45, 49, 56 parts by weight, preferably from 25 to 40 parts by weight.

The present invention does not specifically limit the type of the filler, which may be inorganic filler, organic filler, or a mixture of inorganic and organic filler. Preferably, the filler is any one selected from the group consisting of inorganic filler or/and organic filler. The inorganic filler is any one selected from the group consisting of aluminium hydroxide, silica, talcum powder, boehmite, zeolite, wollastonite, magnesia, calcium silicate, calcium carbonate, clay or mica, or a combination of at least two selected therefrom. The organic filler is any one selected from the group consisting of melamine and/or melamine cyanurate, or a combination of at least two selected therefrom.

Certainly, the well-known additives, such as thermoplastic resins, inorganic fillers, coloring pigments, defoaming agents, surfactants, flame retardants, ultraviolet absorbents, antioxidants, flowing adjustment agents, can be added in the present invention as required. The present invention does not specifically limit the types and addition amounts of additives, and those skilled in the art can choose according to professional knowledge.

By referring to the current methods for preparing resin compositions, those skilled in the art can choose in combination with actual situations the methods for preparing the halogen-free flame-retardant resin composition of the present invention, which are not specifically limited in the present invention. The typical but non-limiting method for preparing the halogen-free flame-retardant resin composition comprises the following steps:

A phosphorous-containing flame retardant in a formula amount was dissolved in a certain liquid solvent (e.g. methyl ethyl ketone MEK, propylene glycol methyl ether PM and the like), stirred till complete dissolution. Then liquid benzoxazine rein, polyepoxy resin and bismaleimide resin, and other additive components (e.g. the additives such as thermoplastic resins, inorganic fillers, coloring pigments and the like) were added. The curing agent and accelerator dissolved in liquid solvent were added, and homogeneously stirred. Finally, a liquid solvent was used to suitably adjust the solid content of the solution to 60-75%, and to obtain a glue solution, i.e. the halogen-free flame-retardant resin of the present invention.

As a preferable technical solution, the halogen-free flame-retardant resin composition of the present invention comprises, based on the weight parts of organic solids, (A) from 1 to 10 parts by weight of bismaleimide resin, (B) from 30 to 60 parts by weight of benzoxazine resin, (C) from 10 to 40 parts by weight of polyepoxy compound, (D) from 5 to 25 parts by weight of phosphorous-containing flame retardant, (E) from 1 to 25 parts by weight of curing agent, which is amine curing agent or phenolic resin curing agent, (F) from 0.1 to 1 part by weight of curing accelerator, and (G) from 5 to 60 parts by weight of filler.

As an optional technical solution, the halogen-free flame-retardant resin composition of the present invention comprises, based on the weight parts of organic solids, (A) from 3 to 7 parts by weight of bismaleimide resin, (B) from 40 to 60 parts by weight of benzoxazine resin, (C) from 10 to 25 parts by weight of polyepoxy compound, (D) from 8 to 18 parts by weight of phosphorous-containing flame retardant, (E) from 1 to 25 parts by weight of curing agent, which is amine curing agent or phenolic resin curing agent, (F) from 0.1 to 1 part by weight of curing accelerator, and (G) from 25 to 40 parts by weight of filler.

The prepreg stated in the second object of the present invention is prepared from the halogen-free flame-retardant resin composition stated in the first object of the present invention.

A prepreg is a composition of resin matrix and reinforcement by impregnating continuous fibers or fabrics with the resin matrix under conditions which are strictly controlled, and is an intermediate material for preparing composite materials.

The prepreg of the present invention comprises a matrix and the halogen-free flame-retardant resin composition attached thereon. The matrix is non-woven fabrics or other fabrics, typically but non-limitedly including natural fibers, organic synthetic fibers, inorganic fibers and the like.

Preferably, the prepreg is prepared by impregnating the matrix in the halogen-free flame retardant resin composition provided in the first object of the present invention, and drying. That is to say, the prepreg comprises a matrix and the halogen-free flame-retardant resin composition attached thereon after impregnating and drying treatments.

As for the method for preparing the prepreg of the present invention, those skilled in the art can refer to the current methods for preparing prepregs, and the present invention does not make any specific definitions. The typical but non-limiting method for preparing the prepreg comprises the following steps:

Impregnating the matrix with the halogen-free flame retardant glue provided in the first object of the present invention, heating and drying the impregnated glass cloth in an oven at a temperature 140-200° C. for 3-8 min.

The laminate in the third object of the present invention comprises several superimposed prepregs stated in the second object of the present invention.

A laminate is one of laminate articles, and is a whole body prepared by superimposing and heat-pressing two or more layers of fibers or fabrics (i.e. prepregs) impregnated with resins.

The laminate of the present invention is preferably prepared by superimposing and heat-pressing two or more layers of the prepregs stated in the second object of the present invention. That is to say, each prepreg used for superimposing the laminate all comprises a matrix and the halogen-free flame-retardant resin composition attached thereon after impregnating and drying treatments.

The method for preparing the laminate of the present invention comprises bonding one or more sheets of prepregs by heating and pressing.

The laminate for printed circuit stated in the fourth object of the present invention comprises several superimposed prepregs stated in the second object of the present invention, and metal foils placed on one or both sides of the superimposed prepregs, wherein each prepreg comprises a matrix and the halogen-free flame-retardant resin composition attached on the matrix after impregnating and drying treatments.

The laminate for printed circuit is obtained by covering metal foils on one or both sides of common laminates.

The present invention does not specifically limit metal foils, and the typical but non-limiting metal foils are copper foils, nickel foils, aluminium foils and SUS foils and the like.

As compared to the prior art, the present invention has the following beneficial effects.

(1) By adding a suitable amount of bismaleimide resin, the present invention achieves object of increasing the toughness of benzoxazine resin while ensuring the heat resistance and humidity resistance thereof.

(2) By introducing polyepoxy resin, the present invention overcomes problems of excessive viscosity and difficult industrial production caused by the introduction of bismaleimide resin since the halogen-free flame retardant resin composition provided has a lower viscosity.

Bismaleimide resin of the present invention contains a small amount of branched chains, which not only overcomes problem of being difficult to dissolve caused by many branched chains, but also avoids malpractice that the samples are easy to crystallize without branched chains. Thus it improves the mechanical performance without prejudice to the operability of the production process.

(3) The prepregs, laminates and laminates for printed circuits of the present invention have excellent flame retardant performance, and the advantages of high glass transition temperature (Tg), high heat resistance, high bending strength, high reliability, low dielectric dissipation factor, low water absorption, low thermal expansion coefficient (C.T.E) and the like. Even more valuably, the prepregs, laminates and laminates for printed circuits of the present invention also have excellent chemical resistance and mechanical processing property.

EMBODIMENTS

In order to better explain the present invention and understand the technical solution of the present invention, the typical but non-limiting examples of the present invention are stated as follows.

The "parts" represents "parts by weight", and the "%" represents "weight %" in the Examples and Comparison Examples, unless specially defined.

The formulae of the halogen-free flame retardant resin compositions provided in Examples 1-8 are shown in Table 1.

TABLE 1

Formulae of the halogen-free flame retardant resin compositions provided in Examples 1-8

| Component* | Examples (parts by weight) | | | | | | | |
|---|---|---|---|---|---|---|---|---|
|  | 1 | 2 | 3 | 4 | 5 | 6 | 7 | 8 |
| A-1 | 5 | 1 | 5 | 10 | 5 | 5 | 10 | 10 |
| A-2 | — | — | — | — | — | — | — | — |
| B-1 | 20 | 20 | 20 | 20 | — | 60 | 20 | 20 |
| B-2 | 30 | 30 | 30 | 30 | 30 | — | 30 | 30 |
| C-1 | 10 | 10 | 10 | 10 | 10 | 10 | 5 | 20 |
| C-2 | 15 | 15 | 15 | 15 | 15 | 15 | 5 | 20 |
| D | 15 | 15 | 15 | 15 | 15 | 15 | 15 | 15 |
| E-1 | 15 | 5 | 5 | 5 | 5 | 5 | 5 | 5 |
| E-2 | — | 1.5 | 1.5 | 1.5 | 1.5 | 1.5 | 1.5 | 1.5 |
| F | 0.15 | 0.15 | 0.15 | 0.15 | 0.15 | 0.15 | 0.15 | 0.15 |
| G-1 | 20 | 20 | 20 | 20 | 20 | 20 | 20 | 20 |
| G-2 | 20 | 20 | 20 | 20 | 20 | 20 | 20 | 20 |

The "Component*" in Table 1 is explained as follows.

A refers to bismaleimide resin.

A-1 refers to bismaleimide resin having a monomer of 1,6-bismaleimido hexane having the following specific structure

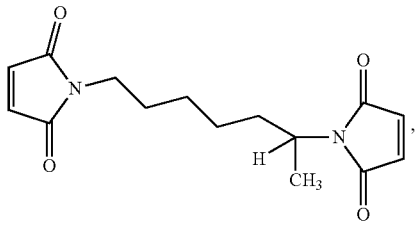 [SMILES: CC(CCCCCN1C(=O)C=CC1=O)N1C(=O)C=CC1=O]

B refers to benzoxazine resin.

B-1 refers to a product purchased from Huntsman Advanced Materials and having a model No. LZ 8280.

B-2 refers to a product purchased from Sichuan EM Technology Co., Ltd and having a model No. D125.

C refers to halogen-free epoxy resin.

C-1 refers to a product having a model of HP-7200HHH and purchased from Japan DIC.

C-2 refers to a product having a model of KF8100 and purchased from Korea KOLON.

D refers to a phosphorous-containing flame retardant having a model of SPB-100 and purchased from Japan Otsuka Chemical Co., Ltd.

E refers to curing agent.

E-1 refers to a product having a model of EPONOL 6635M65 and purchased from Korea Momentive, E-2 refers to a product having a model of DICY and purchased from Ningxia Darong Chemical.

F refers to a curing accelerator, which is 2-phenylimidazole purchased from Shikoku Chemicals Corporation.

G refers to inorganic filler.

G-1 refers to aluminium hydroxide having a purity of more than 99%.

G-2 refers to silicon dioxide having a purity of more than 99%.

The formulae of the halogen-free flame retardant resin compositions provided in Comparison Examples 1-8 are shown in Table 2.

TABLE 2

Formulae of the halogen-free flame retardant resin compositions provided in Comparison Examples 1-8

| Component* | Comparison Examples (parts by weight) | | | | | | | |
|---|---|---|---|---|---|---|---|---|
|  | 1 | 2 | 3 | 4 | 5 | 6 | 7 | 8 |
| A-1 | — | 3 | 20 | — | 5 | 5 | 10 | 10 |
| A-2 | — | — | — | 10 | — | — | — | — |
| B-1 | 20 | 20 | 20 | 20 | 10 | 50 | 20 | 20 |
| B-2 | 30 | 30 | 30 | 30 | 10 | 50 | 30 | 30 |
| C-1 | 10 | — | 10 | 10 | 10 | 10 | 3 | 30 |
| C-2 | 15 | — | 15 | 15 | 15 | 15 | 3 | 30 |
| D | 15 | 15 | 15 | 15 | 15 | 15 | 15 | 15 |
| E-1 | 15 | 5 | 5 | 5 | 5 | 5 | 5 | 5 |
| E-2 | — | 1.5 | 1.5 | 1.5 | 1.5 | 1.5 | 1.5 | 1.5 |
| F | 0.15 | 0.15 | 0.15 | 0.15 | 0.15 | 0.15 | 0.15 | 0.15 |
| G-1 | 20 | 20 | 20 | 20 | 20 | 20 | 20 | 20 |
| G-2 | 20 | 20 | 20 | 20 | 20 | 20 | 20 | 20 |

In Table 2, the "Component*" has the same explanation as those in Table 1.

In addition, A-2 in Table 2 refers to bismaleimide resin of trimethyl hexamethylene bismaleimide having the following specific structure

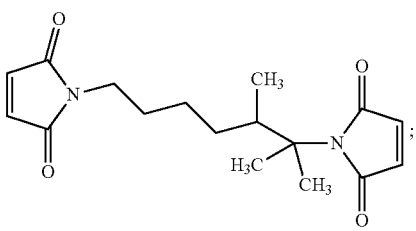 [SMILES: CC(CCCCN1C(=O)C=CC1=O)C(C)(C)N1C(=O)C=CC1=O]

Performance Testing

The halogen-free flame retardant resin compositions provided in Examples 1-8 and Comparison Examples 1-8 were used for preparing laminates for printed circuits according to the following method, and performance testing was performed for the prepared laminates.

The method for preparing laminates for printed circuits comprises
① bonding one or more prepregs together by heating and pressing to prepare laminates;
② bonding metal foils on one or both sides of laminates prepared in step ①;
③ laminating in a laminator.

In step ②, 8 sheets of prepregs and 2 sheets of metal foils in an amount of 1 ounce (having a thickness of 35 μm) were superimposed together.

In step ③, the operation conditions for lamination are stated as follows. When the material temperature ranged from 80 to 140° C., the temperature rising rate was controlled to be 1.5-2.5° C./min; when the material temperature of the outer layer ranged from 80 to 100° C., a full pressure of about 350 psi was applied. During the curing, the material temperature was controlled to be 195° C. and maintained for more than 60 min.

The items and specific method for the performance testing are stated as follows.
(a) Glass transition temperature: tested by the DSC method under IPC-TM-650 2.4.25 in accordance with Differential scanning calorimetry.
(b) Peeling strength: the peeling strength of the metal cover coat was tested under the test conditions "after heat press" in accordance with the method of IPC-TM-650 2.4.8.
(c) Inflaming retarding: tested in accordance with UL94.
(d) Dip-soldering resistance: a sample (a laminate for printed circuit of 100×100 mm) which was maintained for 2 h in a pressure cooking processing device at 121° C. and 105 KPa was dipped for 20 seconds in a solder bath heated to 260° C., to visually observe (h1) whether there was delamination, and (h2) whether there were white spots or wrinkles, and record. The symbols ○ represents unchanged; Δ represents that there are white spots; X represents delamination.
(e) Water absorption: tested according to IPC-TM-650 2.6.2.1
(f) Dielectric dissipation factor: testing the dielectric dissipation factor at 1 GHz by the resonance method of strip lines according to IPC-TM-650 2.5.5.5;
(g) Bending strength: tested by the method in accordance with IPC-TM-650 2.4.4, i.e. testing by apply load at room temperature onto the samples having predetermined size and shape.
(h) Punching: a substrate having a thickness of 1.60 mm was placed on a die having a certain patterning for punching, to visually observe (h1) whether there were no white circles on the side of holes, (h2) whether there were white circles on the side of holes, and (h3) there were crackings on the side of holes, respectively represented by the symbols ○, Δ and X.
(i) Migration resistance: a substrate having a size of 100×100 mm was placed in an oven having a temperature of 200° C. for 4 hours, to visually observe the exudation of substances between laminates, wherein (h1) refers to no exudation; (h2) refers to a little exudation; and (h3) refers to much exudation, respectively represented by the symbols ○, Δ and X.
(j) Anti-CAF: tested according to the standard method of JPCA-ES-04.
(k) Drop hammer impact area: a substrate having a thickness of 1.60 mm and a size of 100×100 mm was horizontally placed on a rack in which there is a circular channel having a diameter of 8 cm and running through the vertical cross-section of the rack; a cross face hammer having a weight of 1 kg and a hammer diameter of 10 mm was placed at a height of 1 m, aligned to the circular cross-section of the rack, vertically free-fall to the plate; calculating the area of white stripes appeared on the plate.
(l) Halogen content: tested according to the testing method of halogen-free copper clad plate in JPCA-ES-01-2003, and testing the halogen content of copper clad laminate by the Oxygen flask combustion method and ion chromatography.

The performance test results of the laminates for printed circuits prepared from the halogen-free flame retardant resin compositions according to Examples 1-8 are shown in Table 3 below.

TABLE 3

Performance test results of the laminates for printed circuits prepared from the resin compositions according to Examples 1-8

| Items | Examples | | | | | | | |
|---|---|---|---|---|---|---|---|---|
| | 1 | 2 | 3 | 4 | 5 | 6 | 7 | 8 |
| Glass transition temperature (Tg, ° C.) | 169 | 172 | 174 | 175 | 161 | 178 | 176 | 158 |
| Peeling strength (N/mm) | 1.36 | 1.42 | 1.38 | 1.31 | 1.46 | 1.35 | 1.26 | 1.54 |
| Inflaming retarding (1.60 mm) | V-0 | V-0 | V-0 | V-0 | V-0 | V-0 | V-0 | V-1 |
| Inflaming retarding (0.80 mm) | V-0 | V-0 | V-0 | V-0 | V-1 | V-0 | V-1 | V-1 |
| Dip-soldering resistance (Delamination) | ○ | ○ | ○ | ○ | ○ | ○ | Δ | ○ |
| Dip-soldering resistance (white spot) | ○ | ○ | ○ | ○ | ○ | ○ | ○ | ○ |
| Water absorption (%) | 0.09 | 0.10 | 0.10 | 0.10 | 0.11 | 0.08 | 0.10 | 0.11 |
| Dielectric dissipation factor (1 GHZ) | 0.005 | 0.005 | 0.005 | 0.005 | 0.005 | 0.005 | 0.005 | 0.005 |

TABLE 3-continued

Performance test results of the laminates for printed circuits prepared from the resin compositions according to Examples 1-8

| Items | Examples | | | | | | | |
|---|---|---|---|---|---|---|---|---|
| | 1 | 2 | 3 | 4 | 5 | 6 | 7 | 8 |
| Bending strength (N/mm$^2$) | 510 | 525 | 505 | 495 | 480 | 550 | 485 | 450 |
| Punching | ○ | ○ | ○ | ○ | ○ | ○ | ○ | ○ |
| Migration resistance | ○ | ○ | ○ | ○ | ○ | ○ | ○ | Δ |
| Anti-CAF(hr) | >1000 | >1000 | >1000 | >1000 | >800 | >1000 | >800 | >500 |
| Drop hammer impact area (mm$^2$) | 250 | 230 | 220 | 180 | 210 | 265 | 205 | 195 |
| Halogen content (%) | 0.03 | 0.03 | 0.03 | 0.03 | 0.03 | 0.03 | 0.03 | 0.03 |

The performance test results of the laminates for printed circuits prepared from the halogen-free flame retardant resin compositions according to Comparison Examples 1-8 are shown in Table 4 below.

TABLE 4

Performance test results of the laminates for printed circuits prepared from the resin compositions according to Comparison Examples 1-8

| Items | Comparison Examples | | | | | | | |
|---|---|---|---|---|---|---|---|---|
| | 1 | 2 | 3 | 4 | 5 | 6 | 7 | 8 |
| Glass transition temperature (Tg, ° C.) | 165 | 154 | 171 | 167 | 163 | 182 | 177 | 155 |
| Peeling strength (N/mm) | 1.30 | 1.08 | 1.32 | 1.25 | 1.58 | 1.34 | 1.20 | 1.60 |
| Inflaming retarding (1.60 mm) | V-0 | V-0 | V-0 | V-1 | V-1 | V-0 | V-0 | V-1 |
| Inflaming retarding (0.80 mm) | V-1 | V-1 | V-1 | V-1 | V-1 | V-0 | V-0 | V-1 |
| Dip-soldering resistance (Delamination) | ○ | Δ | ○ | Δ | ○ | ○ | ○ | ○ |
| Dip-soldering resistance (white spot) | ○ | Δ | ○ | Δ | ○ | ○ | ○ | Δ |
| Water absorption (%) | 0.09 | 0.08 | 0.09 | 0.10 | 0.11 | 0.08 | 0.10 | 0.12 |
| Dielectric dissipation factor (1 GHZ) | 0.005 | 0.005 | 0.005 | 0.005 | 0.005 | 0.005 | 0.005 | 0.005 |
| Bending strength (N/mm$^2$) | 510 | 460 | 480 | 400 | 475 | 580 | 510 | 440 |
| Punching | ○ | Δ | Δ | Δ | ○ | Δ | ○ | ○ |
| Migration resistance | ○ | Δ | ○ | ○ | ○ | ○ | ○ | Δ |
| Anti-CAF (hr) | >1000 | >500 | >1000 | >500 | >800 | >1000 | >800 | >400 |
| Drop hammer impact area (mm$^2$) | 280 | 270 | 160 | 140 | 200 | 285 | 225 | 180 |
| Halogen content (%) | 0.03 | 0.03 | 0.03 | 0.03 | 0.03 | 0.03 | 0.03 | 0.03 |

In Table 4, the halogen-free resin composition provided in Comparison Example 4 is much difficult to dissolve; the composition glue solution has a high viscosity, and the gluing yield is low. During actual operations, the decrease of the environmental temperature readily induces the separation of bismaleimide resin, which greatly affects the production efficiency and causes certain quality problems. The halogen-free resin compositions provided in Examples 1-8 can better adapt existing equipments and process control conditions, and can be continuously and stably produced without any additional equipment. In addition, it has a high gluing yield and a controllable quality.

According to the performance testing results in Table 4, it can be seen that the composition containing no bismaleimide (see Comparison Example 1) has a bigger drop hammer area and a worse toughness. The composition having no polyepoxy (see Comparison Example 2) has a very low peeling strength, a notably decreased bending strength and a worse reliability (anti-CAF). Although the composition having an excessive bismaleimide (see Comparison Example 3) has a better toughness performance, a decreased peeling strength and a reduced bending strength affect the comprehensive performance of the composition. Bismaleimide resin having more branched chains (see Comparison Example 4) has problems of being difficult to dissolve and having a worse technological efficiency. The amount of benzoxazine resin has a notable effect on the composition. If the amount thereof is below 30 parts by weight (see Comparison Example 5), retardant inadequacy will take place; if the amount goes beyond 60 parts by weight (see Comparison Example 6), the punching property thereof will be decreased though a higher Tg is readily obtained. If the polyepoxy resin amount is reduced below 10 parts by weight (see Comparison Example 7), the peeling strength thereof will be sharply decreased to affect the application thereof. If polyepoxy is in an excessive amount (see Comparison Example 8), the glass transition temperature, inflaming retarding and reliability all will be decreased.

According to the halogen-free resin flame-retardant compositions provided in Examples 1-8 and Comparison Examples 1-8 and the corresponding performance testing results, it can be seen that the efficient combinations of various types, classes and contents of the resin composition components of the present invention, especially the selection of epoxy resins, makes the resin compositions ensure a higher peeling strength of the resin compositions provided therein, while increasing the process operability of the compositions. The selection of bismaleimide resin makes the resin composition provided therein maintain excellent properties, such as a higher glass transition temperature (Tg) and a high reliability, while obtaining a higher toughness.

According to the results above, it can be seen that the laminates for printed circuits prepared from the halogen-free flame retardant resin composition provided in the present invention greatly decrease the fragility of the benzoxazine system and increase the toughness of the laminates while maintaining high glass transition temperature, high reliability, inflaming retarding, dip-soldering resistance, chemical resistance, low hydroscopicity, lower dielectric dissipation factor. In addition, the halogen content can achieve the V-0 standard in the flame retardancy test UL94 within the scope of halogen-free standard of JPCA. The halogen content of the present invention is less than 0.09 wt. %, so as to achieve the effect of environmental protection.

The formulae of the halogen-free flame retardant resin compositions provided in Examples 9-12 and Comparison Examples 9-12 are shown in Table 5.

TABLE 5

Formulae of the halogen-free flame retardant resin compositions provided in Examples 9-12 and Comparison Examples 9-12

| Components* | Examples (parts by weight) | | | | Comparison Examples (parts by weight) | | | |
|---|---|---|---|---|---|---|---|---|
| | 9 | 10 | 11 | 12 | 9 | 10 | 11 | 12 |
| A-1 | 5 | 5 | 5 | 5 | 5 | 5 | 5 | 5 |
| B-1 | 15 | 15 | 30 | 30 | 10 | 10 | 50 | 50 |
| B-2 | 15 | 15 | 30 | 30 | 10 | 10 | 50 | 50 |
| C-1 | 20 | 20 | 20 | 20 | 20 | 20 | 20 | 20 |
| D | 25 | 25 | 5 | 5 | 5 | 25 | 25 | 25 |
| E-2 | 1.5 | 1.5 | 1 | 1 | 1.5 | 1.5 | 1 | 1 |
| F | 0.15 | 0.15 | 0.15 | 0.15 | 0 | 0.15 | 0 | 0.15 |
| G-1 | 20 | 0 | 0 | 0 | 0 | 50 | 0 | 0 |
| G-2 | 0 | 0 | 20 | 0 | 0 | 0 | 0 | 50 |

In Table 5, the "Component*" has the same explanation as those in Table 1.

The performance test results of the laminates for printed circuits prepared from the halogen-free flame retardant resin compositions according to Examples 9-12 and Comparison Examples 9-12 are shown in Table 6 below.

TABLE 6

Performance test results of the laminates for printed circuits prepared from the resin compositions according to Examples 9-12 and Comparison Examples 9-12

| Items | Examples | | | | Comparison Examples | | | |
|---|---|---|---|---|---|---|---|---|
| | 9 | 10 | 11 | 12 | 9 | 10 | 11 | 12 |
| Glass transition temperature (Tg, ° C.) | 161 | 163 | 174 | 172 | 147 | 152 | 180 | 188 |
| Peeling strength (N/mm) | 1.43 | 1.47 | 1.40 | 1.54 | 1.54 | 1.42 | 1.38 | 1.26 |
| Inflaming retarding (1.60 mm) | V-0 | V-0 | V-0 | V-0 | V-1 | V-0 | V-0 | V-0 |
| Inflaming retarding (0.80 mm) | V-0 | V-0 | V-0 | V-0 | V-1 | V-1 | V-0 | V-0 |
| Dip-soldering resistance (Delamination) | ○ | ○ | ○ | ○ | ○ | ○ | ○ | ○ |
| Dip-soldering resistance (white spot) | ○ | ○ | ○ | ○ | ○ | ○ | ○ | ○ |
| Water absorption (%) | 0.10 | 0.10 | 0.09 | 0.10 | 0.14 | 0.12 | 0.08 | 0.07 |
| Dielectric dissipation factor (1 GHZ) | 0.005 | 0.005 | 0.005 | 0.005 | 0.006 | 0.006 | 0.004 | 0.004 |
| Bending strength (N/mm$^2$) | 530 | 515 | 545 | 520 | 475 | 485 | 620 | 650 |
| Punching | ○ | ○ | ○ | ○ | Δ | Δ | Δ | X |
| Migration resistance | ○ | ○ | ○ | ○ | Δ | ○ | ○ | ○ |
| Anti-CAF(hr) | >1000 | >1000 | >1000 | >1000 | >600 | >800 | >1000 | >1000 |
| Drop hammer impact area (mm$^2$) | 256 | 285 | 240 | 280 | 285 | 250 | 390 | 345 |
| Halogen content (%) | 0.04 | 0.04 | 0.03 | 0.03 | 0.04 | 0.04 | 0.03 | 0.02 |

According to the performance test results in Table 6, it can be seen that, when the benzoxazine resin content ranges from 30 to 60 parts by weight, the composition can have a glass transition temperature (Tg) of more than 160° C., a inflaming retarding of UL94V-0, a water absorption of about 0.10% and a better toughness. When the benzoxazine resin content is lower than 30 parts by weight, it has a notably decreased glass transition temperature (Tg), an increased water absorption, and a decreased Anti-CAF, which all seriously affected the overall performance of the composition, though the peeling strength is improved. When the benzoxazine content is higher than 60 parts by weight, the composition shows a deteriorated toughness and a decreased processability, so that it cannot meet the requirements. Fair use of fillers can decrease the water absorption of the composition, increase the reliability thereof, and increase the comprehensive performance of the resin composition.

It should be noticed and understood that, without departing from the spirit and scope of the present invention claimed in the claims, modifications and changes can be made to the present invention detailedly stated above. Thus the scope of the claimed technical solution is not limited by any specific exemplary teachings provided therein.

The applicant declares that, the present invention detailedly discloses the process of the present invention by the aforesaid examples, but the present invention is not limited by the detailed process, i.e. it does not mean that the present invention cannot be fulfilled unless the aforesaid detailed process is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A halogen-free flame-retardant resin composition, based on the weight parts of organic solids, comprising
    (A) from 1 to 10 parts by weight of bismaleimide resin,
    (B) from 30 to 60 parts by weight of benzoxazine resin,
    (C) from 10 to 40 parts by weight of polyepoxy compound,
    (D) from 5 to 25 parts by weight of phosphorous-containing flame retardant, and
    (E) from 1 to 25 parts by weight of curing agent, which is amine curing agent and/or phenolic resin curing agent;
    wherein the bismaleimide resin is obtained by polymerizing the following bismaleimide monomer,

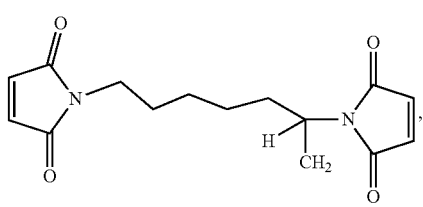 [SMILES: CC(CCCCCN1C(=O)C=CC1=O)N1C(=O)C=CC1=O]

2. The composition according to claim 1, characterized in that the benzoxazine resin is any one selected from the group consisting of bisphenol-A benzoxazine resin, bisphenol-F benzoxazine resin, phenolphthalein benzoxazine resin, MDA benzoxazine resin, and a combination of at least two selected therefrom.

3. The composition according to claim 1, characterized in that the polyepoxy compound is any one selected from the group consisting of bisphenol-A epoxy resin, bisphenol-F epoxy resin, phenol novolac epoxy resin, o-cresol formaldehyde epoxy resin, bisphenol-A novolac epoxy resin, epoxy resin having biphenyl structure, epoxy resin having aralkyl structure, dicyclopentadiene epoxy resin, halogen-free epoxy resin having oxazolidinone ring, epoxidised polybutadiene, and a combination of at least two selected therefrom.

4. The composition according to claim 1, characterized in that the phosphorous-containing flame retardant is selected from the group consisting of resorcinol-bi(diphenyl phosphate), bisphenol-A bi(diphenyl phosphate), resorcinol-bi(2,6-xylyl phosphate), dimethyl methylphosphate, phosphazene compound, and a combination of at least two selected therefrom.

5. The composition according to claim 1, characterized in that the phenolic resin curing agent is any one selected from the group consisting of phenolic novolac resin, bisphenol-A novolac resin, nitrogen-containing novolac resin, biphenyl novolac resin, aralkyl novolac resin, alkyl novolac phosphorous-containing novolac resin, and a combination of at least two selected therefrom;
    the amine curing agent is selected from the group consisting of dicyandiamide curing agent and aromatic amine curing agent, wherein the aromatic amine curing agent is selected from the group consisting of diamino diphenyl ether, diamino diphenyl sulfone, diamino diphenyl methane, m-xylylenediamine, benzidine, and a combination of at least two selected therefrom.

6. The composition according to claim 1, characterized in that the bismaleimide resin in the halogen-free flame-retardant resin composition is in an amount of from 3 to 7 parts by weight.

7. The composition according to claim 1, characterized in that the composition further comprises from 0.1 to 1 part by weight of (F) a curing accelerator.

8. The composition according to claim 7, characterized in that the curing accelerator is an imidazole compound, wherein the imidazole compound is any one selected from 2-methylimidazole, 2-ethyl-4-methylimidazole, 2-phenylimidazole or 2-phenylimidazole, 2-undecylimidazole, and a combination of at least two selected therefrom.

9. The composition according to claim 1, characterized in that the composition further comprises from 5 to 60 parts by weight of (G) a filler.

10. The composition according to claim 9, characterized in that the filler is selected from the group consisting of inorganic filler or/and organic filler.

11. The composition according to claim 10, characterized in that the inorganic filler is any one selected from the group consisting of aluminium hydroxide, silica, talcum powder, boehmite, zeolite, wollastonite, magnesia, calcium silicate, calcium carbonate, clay, mica, and a combination of at least two selected therefrom; the organic filler is any one selected from the group consisting of melamine, melamine cyanurate, and a combination of at least two selected therefrom.

12. The composition according to claim 1, characterized in that based on the weight of organic solids, the benzoxazine resin is in an amount of more than 50% of the total weight of the resin in the halogen-free flame-retardant resin composition.

13. The composition according to claim 1, characterized in that the benzoxazine resin in the halogen-free flame-retardant resin composition is in an amount of from 40 to 60 parts by weight.

14. The composition according to claim 1, characterized in that the polyepoxy compound in the halogen-free flame-retardant resin composition is in an amount of from 10 to 25 parts by weight.

15. The composition according to claim 1, characterized in that the phosphorous-containing flame retardant in the halogen-free flame-retardant resin composition is in an amount of from 8 to 18 parts by weight.

16. A prepreg, characterized in that the prepreg comprises the halogen-free flame-retardant resin composition according to claim 1.

17. The prepreg according to claim 16, characterized in that the prepreg comprises fiber or fabric and the halogen-free flame-retardant resin composition attached thereon after impregnating and drying treatments.

18. A laminate, characterized in that the laminate comprises several superimposed prepregs according to claim 16.

19. The laminate according to claim 18, characterized in that each prepreg comprises fiber or fabric and the halogen-free flame-retardant resin composition attached thereon after impregnating and drying treatments.

20. A laminate for printed circuit, characterized in that the laminate for printed circuit comprises several superimposed prepregs according to claim 16, and metal foils placed on one or both sides of the superimposed prepregs.

* * * * *

UNITED STATES PATENT AND TRADEMARK OFFICE
CERTIFICATE OF CORRECTION

PATENT NO. : 10,696,844 B2  
APPLICATION NO. : 15/120549  
DATED : June 30, 2020  
INVENTOR(S) : Long Xi et al.

Page 1 of 1

It is certified that error appears in the above-identified patent and that said Letters Patent is hereby corrected as shown below:

In the Claims

At Column 19, Claim number 1, Line numbers 50-59, replace

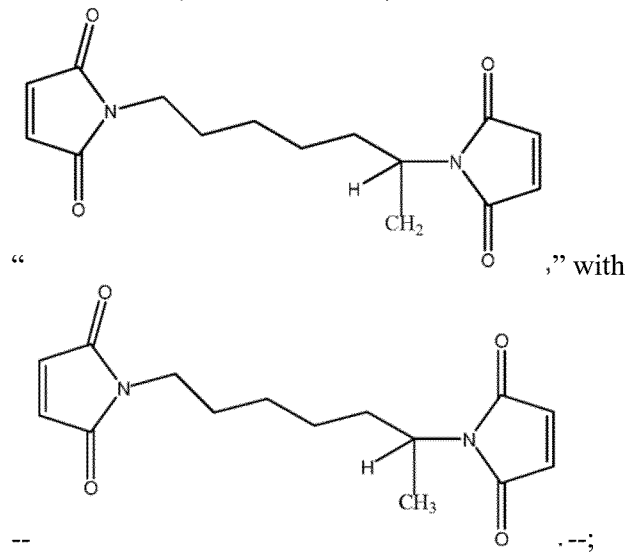

" " with " -- -- ";

At Column 20, Claim number 8, Line numbers 42 and 43, delete "2-phenylimidazole or".

Signed and Sealed this  
Eighteenth Day of August, 2020

Andrei Iancu  
*Director of the United States Patent and Trademark Office*